(12) United States Patent
Shizukuishi

(10) Patent No.: US 6,781,178 B2
(45) Date of Patent: Aug. 24, 2004

(54) NON-VOLATILE SOLID STATE IMAGE PICKUP DEVICE AND ITS DRIVE

(75) Inventor: Makoto Shizukuishi, Miyagi (JP)

(73) Assignee: Fuji Photo Film Co., Ltd., Kanagawa (JP)

(*) Notice: Subject to any disclaimer, the term of this patent is extended or adjusted under 35 U.S.C. 154(b) by 0 days.

(21) Appl. No.: 10/100,069

(22) Filed: Mar. 19, 2002

(65) Prior Publication Data

US 2002/0171102 A1 Nov. 21, 2002

(30) Foreign Application Priority Data

Mar. 22, 2001 (JP) ........................................ 2001-083374

(51) Int. Cl.$^7$ ............................................. H01L 27/108
(52) U.S. Cl. ..................... 257/296; 257/298; 348/222.1; 348/294; 348/302; 365/110
(58) Field of Search ................................ 257/296, 298; 348/294, 302; 365/110

(56) References Cited

U.S. PATENT DOCUMENTS

| | | | |
|---|---|---|---|
| 5,043,946 A | | 8/1991 | Yamauchi et al. |
| 5,075,888 A | | 12/1991 | Yamauchi et al. |
| 5,140,552 A | | 8/1992 | Yamauchi et al. |
| 5,181,188 A | | 1/1993 | Yamauchi et al. |
| 5,416,516 A | * | 5/1995 | Kameyama et al. ........ 348/246 |
| 5,953,061 A | | 9/1999 | Biegelsen et al. |
| 6,400,448 B1 | * | 6/2002 | Sugawara et al. ......... 356/5.01 |
| 6,492,694 B2 | * | 12/2002 | Noble et al. ................ 257/410 |
| 6,586,771 B2 | * | 7/2003 | Suzuki ........................ 257/72 |
| 2002/0017666 A1 | * | 2/2002 | Ishii et al. .................. 257/291 |
| 2002/0050962 A1 | * | 5/2002 | Kasai .......................... 345/76 |
| 2002/0101527 A1 | * | 8/2002 | Endo .......................... 348/302 |

FOREIGN PATENT DOCUMENTS

JP  02000307962 A  * 11/2000  ......... H01L/27/146

* cited by examiner

Primary Examiner—Viet Q. Nguyen
(74) Attorney, Agent, or Firm—Arent Fox, PLLC

(57) ABSTRACT

A solid state image pickup device is provided which performs a new form of image signal reading operation. The image pickup deice comprises a semiconductor substrate and a plurality of pixels that are formed on the semiconductor substrate, with each pixel having a photodetection element, which generates signal charges upon receiving incident light, a first MOS transistor structure, which has a first floating gate that is disposed above the semiconductor substrate and a first control gate that is capacitively coupled to the first floating gate, and a second MOS transistor structure, which has a second floating gate that is disposed above the semiconductor substrate and is electrically connected to the first floating gate and a second control gate that is capacitively coupled to the second floating gate.

15 Claims, 7 Drawing Sheets

FIG.3B          FIG.3C

NON-VOLATILE SOLID STATE IMAGE PICKUP DEVICE AND ITS DRIVE

CROSS REFERENCE TO RELATED APPLICATION

This invention is based on and claims priority of Japanese patent application 2001-083374, filed on Mar. 22, 2001, the whole contents of which are incorporated herein by reference.

BACKGROUND OF THE INVENTION

1. Field of the Invention

This invention concerns a non-volatile solid state image pickup device and a driving method therefor and in particular concerns a non-volatile solid state image pickup device with a new pixel structure and a non-volatile solid state image pickup device drive method, wherein a new form of pixel signal reading operation is performed.

2. Description of the Related Art

MOS type solid state image pickup devices, CCD type solid state image pickup devices, CMOS type solid state image pickup devices, etc., are known as prior-art types of solid state image pickup devices.

FIG. 5 shows the structure of a prior-art MOS type solid state image pickup device.

Numerous pixels PX are aligned in array form on the surface of a semiconductor substrate. Each pixel PX contains a single photodiode PD, which is a photosensitive element, and a single MOS field effect transistor MOSFET for reading the charges that have accumulated in the photodiode PD. In the illustrated arrangement, the cathode of the photodiode PD comprises a charge accumulation region and is connected to the source region of the MOSFET A row selection signal line 103 is connected to the gate of the MOSFET and the drain of the MOSFET is connected to a read signal line 105.

Row selection signal line 103 is connected to a vertical shift register VSR and receives row selection signals successively. Read signal line 105 is connected via a column selection transistor 107 to an output amplifier AMP. The control electrode of column selection transistor 107 is connected to a horizontal shift register HSR and receives column selection signals successively. A timing generator 109 supplies a timing signal to horizontal shift register HSR and vertical shift register VSR.

While a single pixel row is being selected by vertical shift register VSR, horizontal shift register HSR successively selects the respective columns and supplies the charges of the single row to output amplifier AMP.

This arrangement is similar to the arrangement of a DRAM, with which a memory cell is arranged from a single MOSFET and a single capacitor. Though this arrangement uses a MOSFET, it does not have an amplification function and is thus also called a passive sensor. The structure shown in FIG. 5 has been manufactured normally using an n-MOS process.

When there is scattering of the electrical characteristics of the MOSFET's that carry out switching, non-uniformity of output will occur among pixels receiving the same amount of light and this will cause fixed pattern noise.

It is impossible to perform the image pickup operation of all pixels at once and when a moving subject is captured, the image will become blurred. It is also difficult to electronically clear the accumulated charges of all pixels at once.

FIG. 6 shows the structure of an interline CCD (IT-CCD), which is used most often among solid state image pickup devices.

With an IT-CCD, pixels, each comprised of a photodiode PD and a MOSFET, are aligned in array form as in the arrangement of FIG. 5. However, with an IT-CCD, a vertical charge coupled device VCCD is disposed, in place of a read signal line, between pixel columns. A VCCD is connected at one end to a horizontal charge coupled device HCCD. The output end of the HCCD is connected to a floating diffusion amplifier FDA.

With an IT-CCD, the signal charges that have accumulated in the cathode region of the photodiode PD is transferred from the MOSFET to the VCCD, HCCD, and FDA, that is, transferred only among semiconductors. A VCCD has multiple transfer stages and can hold charges. Charges can thus be read into a VCCD from a number of pixels simultaneously. A still image that does not become blurred can thus be output.

A light shielding film is disposed above the charge transfer paths of the VCCD's and the HCCD and prevents light from entering into the charge transfer paths. A highly sensitive solid state image pickup device, which is not influenced readily by noise, is thus realized. Also, improvement of the image quality by employment of a fully depleted photodiode structure is progressing. Since the charges generated at the pixels can be moved to the VCCD simultaneously via transfer gates, a so-called full electronic shutter can be realized.

An IT-CCD requires a high voltage for driving, is high in consumption power, and is difficult to drive with a single power source. An IT-CCD is manufactured by a specialized process that differs from a general CMOS process. Since the charges that have been read out from the photodiodes PD are output via the VCCD's and the HCCD, random access is difficult.

FIG. 7 shows a CMOS type solid state image pickup device. Though the arrangement for just one pixel is shown in the Figure, the pixels PX are aligned in array form as in the arrangements of FIG. 5 and FIG. 6.

Each pixel PX contains a photodiode PD, a source follower amplifier SFA for amplifying and reading the charges that have accumulated in the photodiode PD, and a reset transistor RT. The source follower amplifier SFA contains an amplifying transistor 121, which receives the signal voltage at the gate, and a transfer transistor 123.

The respective current terminals of transfer transistor 123 and reset transistor RT are connected to a power source line 117. The other end of amplifying transistor 121 is connected to a read signal line 113. The gate electrode of transfer transistor 123 is connected via a row selection signal line 111 to a vertical shift register VSR. The gate electrode of reset transistor RT is connected to a reset signal line 115.

Read signal line 113 is connected via a noise canceller 131 to a column selection transistor 133. The other end of column selection transistor 133 supplies an output signal via output amplifier AMP. The gate electrode of column selection transistor 133 is connected to a horizontal shift register HSR.

With the spread of portable information terminals, personal computer (PC) input cameras, and compact digital still (DS) cameras, solid state image pickup devices of low power consumption are required. CMOS solid state image pickup devices, which are based on a CMOS process and which, in comparison to a CCD type device, can be driven by a single power supply and at low power consumption, are thus being developed. With a CMOS arrangement, on-chip peripheral circuits can be realized readily and low power consumption can be realized.

Improvement of the characteristics and practical application of CMOS type solid state image pickup devices are thus progressing while making use of the abovementioned merits. With a CMOS type solid state image pickup device, low noise is realized by providing an amplification circuit for each pixel. Since a pixel contains an active element, the device is also called an active pixel sensor (APS). However, in addition to a photodiode, three or more transistors (MOSFET) are required per pixel.

When the number of MOSFET's per unit pixel increases, the operation margin of the photodiode part becomes stringent and high sensitivity and high number of (multiple) pixels become difficult to achieve. With a photodiode type CMOS solid state image pickup device, since ohmic contact is made between the reading circuit and the photodiode, it is difficult to make the entire charge accumulation region low in concentration and thus difficult to realize a fully depleted photodiode structure. Fixed pattern noise (FPN), which occurs in accordance to the deviation of the depletion layer capacity of the photodiodes, and reset noise, due to thermal fluctuation of the channel resistance of the reset transistors RT, thus occur in the process of resetting the photodiodes to a fixed potential.

Due to being an XY successive addressing type arrangement, the image becomes blurred when a moving subject is captured and a completely electronic shutter function is difficult to realize.

The prior-art solid state image pickup devices thus had such respective merits and demerits.

SUMMARY OF THE INVENTION

An object of this invention is to provide a solid state image pickup device based on a new operation principle.

Another object of this invention is to provide a new operation method for a solid state image pickup device.

Yet another object of this invention is to provide a solid state image pickup device of a new arrangement with an electronic shutter function.

Yet another object of this invention is to provide a solid state image pickup device that uses two or less transistors per pixel and is suitable for achieving compactness.

A first aspect of this invention provides a solid state image pickup device comprising a semiconductor substrate and a plurality of pixels that are formed on said semiconductor substrate, with each pixel having a photodetection element, which generates signal charges upon receiving incident light, and a non-volatile memory structure, which is connected to said photodetection element, takes in at least part of said signal charges, and can generate a signal voltage corresponding to the signal charges.

By another aspect of this invention, a solid state image pickup device is provided which has a semiconductor substrate of a first conductivity type; a well region formed in said semiconductor substrate and having a second conductivity type that is opposite to the first conductivity type; a plurality of pn junction diodes, each of which has an embedded charge accumulation region of the first conductivity type formed within said well region; a plurality of first MOS transistor structures, each of which is associated with one of said embedded charge accumulation region as a first source region, and has a first floating gate that is formed above said semiconductor substrate, a first control gate that is capacitively coupled to said first floating gate, and a first drain region that is formed within said well region; and second MOS transistor structures, each having a second source region and a second drain region, which are positioned in the vicinity of an associated one of said first MOS transistor structures and are formed within said well region, a second floating gate, which is formed above said semiconductor substrate and is electrically connected with said first floating gate, and a second control gate, which is capacitively coupled to said second floating gate.

Yet another aspect of this invention provides a method of driving a solid state image pickup device comprising a semiconductor substrate of a first conductivity type, a well region formed in said semiconductor substrate and having a second conductivity type that is opposite to the first conductivity type, a plurality of pn junction diodes, each of which has an embedded charge accumulation region of the first conductivity type formed within said well region, a plurality of first MOS transistor structures, each of which is associated with one of said embedded charge accumulation region as a first source region, and has a first floating gate that is formed above said semiconductor substrate, a first control gate that is capacitively coupled to said first floating gate, and a first drain region that is formed within said well region, and second MOS transistor structures, each having a second source region and a second drain region, which are positioned in the vicinity of an associate one of said first MOS transistor structures and are formed within said well region, a second floating gate, which is formed above said semiconductor substrate and is electrically connected with said first floating gate, and a second control gate, which is capacitively coupled to said second floating gate, said solid state image pickup device driving method comprising the steps of (a) letting light incident on said plurality of pn junction diodes and accumulating charges that express image information in said embedded charge accumulation regions, (b) applying a write control voltage to said well regions and said first MOS transistor structures and injecting at least a part of said charges that express image information as signal charges into said first floating gate, and (c) applying a control voltage to said second MOS transistor structures and detecting a threshold voltage.

By immediately injecting the generated charges into floating gate FG, the charge quantity (current) can be converted into a MOS threshold voltage value and held in a non-volatile state at least temporarily.

A low power consumption drive can thus be realized and completely electronic shutter operation can be performed. Also, since the device is a voltage detection type element, it is wide in the dynamic range of the output signal and can accommodate for the decrease of signal amount due to the making of the structure fine (scaling) and making of the number of pixels large.

Since the device is not readily influenced by the scattering among cells and noise, a solid state image pickup device of high image quality is realized. Since a temporary non-volatile storage function is provided, the peripheral circuitry is simplified and the cost of the system as a whole is reduced.

BRIEF DESCRIPTION OF THE DRAWINGS

FIGS. 3A, 3B, and 3C are sectional views and plan views, which show the pixel structure.

DETAILED DESCRIPTION OF THE PREFERRED EMBODIMENTS

A pixel can be arranged using a photodiode and a non-volatile memory element equipped with a MOS transistor structure having a floating gate. At least a part of the signal charges, which have been generated (accumulated) in the photodiode as a result of optical signals that have been made incident from the exterior, is injected into the floating gate. The MOS transistor structure's threshold voltage (Vth), which varies according to the injected signal charge quantity, is detected and output to the exterior.

A unit pixel contains two non-volatile memory elements and the floating gates of these elements are connected to each other. That is, two control gates are provided for one floating gate. One of these is the write control gate, which performs the injection of charges, and the other is the control gate for reading out the threshold value that varies according to the injected charge quantity.

With a prior-art non-volatile memory structure, channel hot electrons (CHE) are used and the electrons are injected into the floating gate. A large portion of the electrons flow outside the memory and are not injected into the floating gate FG The injection efficiency is low and is 1% or less. In contrast, when charge injection is performed using a Fowler-Nordheim (F-N) tunnel current, though the quantity of charge that is lost is reduced significantly, a large amount of time is required to inject a predetermined quantity of charge. With a solid state image pickup device, this injection efficiency and injection rate influence the sensitivity and response speed of the sensor. The process of writing (image capturing) by CHE injection shall be described below. However, the writing process is not limited thereto.

Figure 1A:
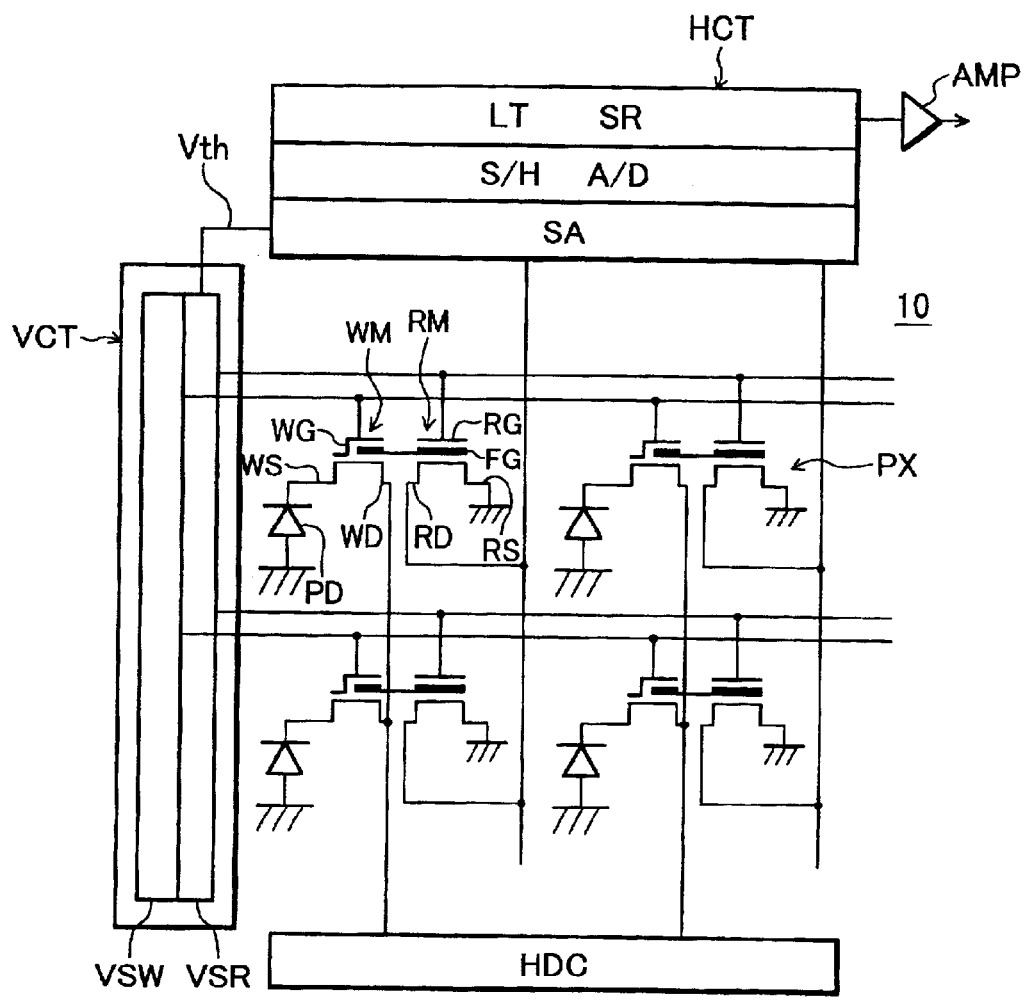
FIGS. 1A and 1B are equivalent circuit diagrams of a solid state image pickup device of an embodiment of this invention.

FIG. 1(A) shows the arrangement of a solid state image pickup device, wherein pixels PX are aligned in a two-dimensional array form on a semiconductor substrate 10. The pixels PX are aligned in a two-dimensional array form and thereby form a photosensitive surface. Each pixel PX has a single photodiode PD, which is the photosensitive element, a write memory element WM, and a read memory element RM.

Write memory element WM is arranged as a MOS transistor structure having a write source WS, which is connected to photodiode PD, a floating gate FG, a write control gate WG, and a write drain WD. Read memory element RM is arranged as a MOS transistor structure having a read source RS, a floating gate FG, a read control gate RG, and a read drain RD. The floating gates FG of both MOS transistor structures are connected together electrically.

Write control gate WG is controlled by a write vertical shift register VSW of a vertical (V) control circuit (VCT). Write drain WD is controlled by a horizontal (H) drain control circuit HDC.

Read control gate RG has a voltage, which for example increases monotonously in the form of a triangular wave, supplied from a read vertical shift register VSR of vertical control circuit VCT. A sense amplifier SA supplies a drain voltage to read drain RD and reads the current value at read drain RD with respect to the potential of read control gate RG to detect the threshold voltage Vth of the memory element.

Figure 1B:
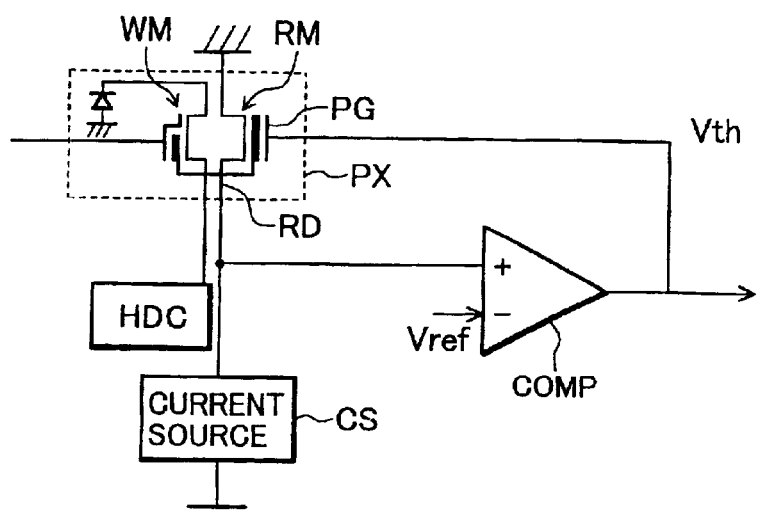

FIG. 1(B) shows an equivalent circuit of the threshold detection circuit of sense amplifier SA. A reference potential Vref is supplied to the inverted input terminal of a comparator COMP and the voltage of the read drain RD of read memory element RM is supplied to the non-inverted input terminal. Current from a current source CS is supplied to read memory element RM. The output voltage of comparator COMP is supplied to read control gate RG. Read control gate RG is made independent of write control gate WG and is controlled by read vertical shift register VSR.

By detecting the channel current of read memory element RM while varying the reference potential Vref, the threshold voltage Vth of the memory is output.

As shown in FIG. 1(A), a sample hold circuit S/H, AD converter A/D, etc., for digitizing the threshold voltage are also provided on-chip on semiconductor substrate 10. The data that have been subject to AD conversion are recorded in latch circuit LT, read out successively in the horizontal direction by horizontal shift register SR, and output via output buffer amplifier AMP to the exterior of the image pickup device as digital data.

As shown in FIG. 1(A), each unit pixel is provided with two non-volatile memories, which share a floating gate FG and are divided in role to perform photodetection/storage and reading, respectively. The write memory element that performs photodetection and storage is preferably made high in CHE injection efficiency as this influences the sensitivity as has been mentioned above. On the other hand, the read memory element is preferably a cell, which is large in the width of the threshold voltage that is read and with which high-speed reading is possible.

Figure 2A:
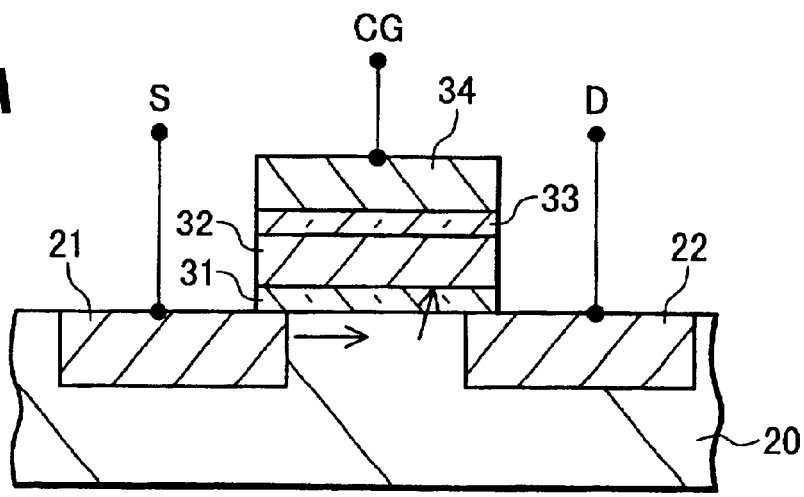
FIGS. 2A, 2B, and 2C are sectional views, which show structures of the non-volatile memory used in the solid state image pickup device of FIGS. 1A and 1B.
Figure 2B:
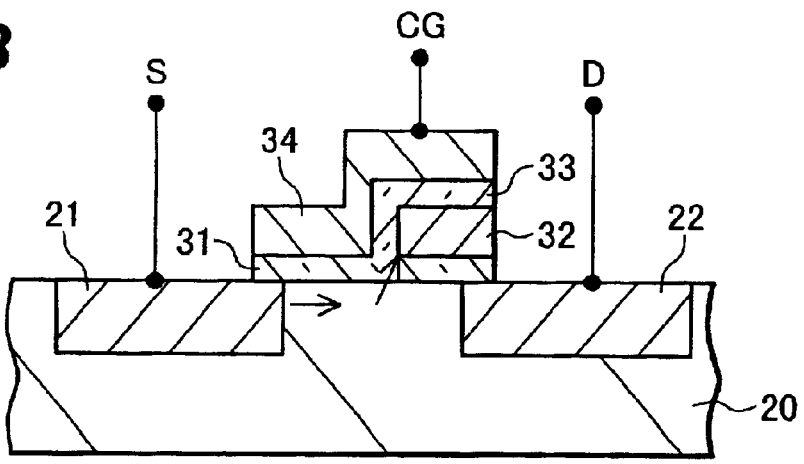
Figure 2C:
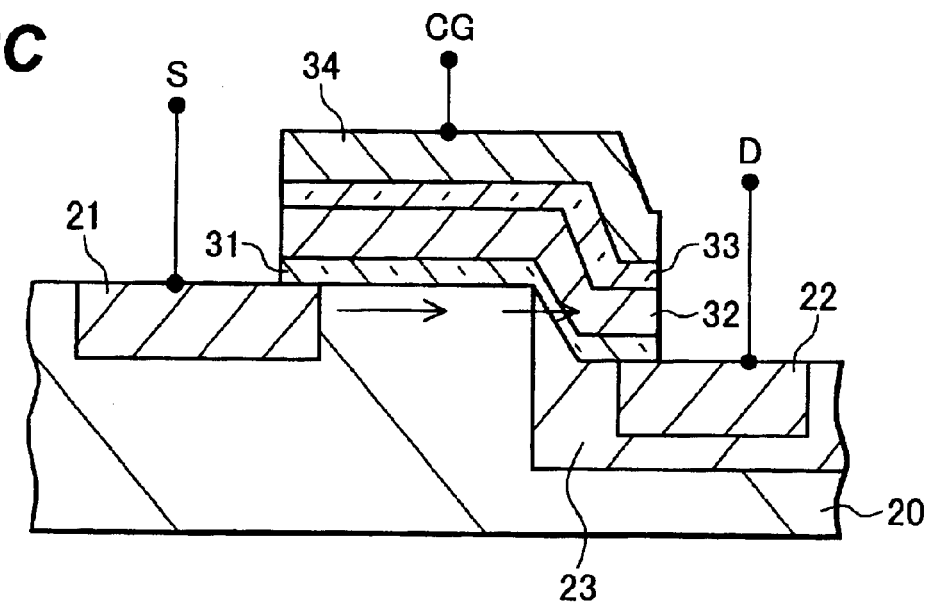

FIG. 2(A) to FIG. 2(C) show examples of MOS transistor structures used within a pixel. FIG. 2(A) shows what is called a stack type cell, which is simplest in structure and widely used. A gate insulator film 31, floating gate 32, insulator film 33, and control gate 34 are laminated on the surface of a p-type region 20 of the semiconductor substrate, and floating gate 32 and control gate 34 are patterned to have the same shape. An n-type source region 21 and an n-type drain region 22 are formed at the respective sides of the gate structure.

Though this structure can be manufactured by replacing the step of film-forming a gate electrode after formation of the gate insulator film by the step of laminating the floating gate 32, insulator film 33, and control gate 34 in the normal process of manufacturing a MOS transistor, with the present embodiment, the floating gate and the control gate are patterned separately.

For example, by grounding the source electrode S and applying predetermined high voltages respectively to control gate CG and drain electrode D, electrons from source region 21 can be guided, accelerated at the channel region, and injected as hot electrons beyond gate insulator film 31 and into floating gate 32.

Since a stack type cell is low in injection efficiency, it is mainly used as a one-time memory (ROM) in many cases. Reading on the other hand can be performed at high speed.

FIG. 2(B) shows an element structure with which the injection efficiency of the stack-type non-volatile memory cell of FIG. 2(A) has been improved, and this structure is called a split (channel) type cell. With this arrangement, a floating gate 32 is provided only above the drain side region of the channel region. Control gate 34 is formed after forming the insulator film 33 that covers the upper surface of floating gate 32. Control gate 34 is disposed directly on the gate insulator film above the source side region of the channel region. The structure is otherwise the same as that of FIG. 2(A).

Since at the source side region of the channel region, the potential of the channel region can be controlled directly by the control gate, hot electrons can be formed efficiently and injected into floating gate 32.

FIG. 2(C) shows a structure called a ballistic injection type cell with which the injection efficiency has been further improved (U.S. Pat. No. 5,780,341). With this structure, a step is formed on the surface of a semiconductor substrate. This step is made high at the source side and low at the drain side so that electrons will enter into floating gate 32 upon proceeding rectilinearly from a source region 21 and passing through gate insulator film 31. Gate insulator film 31, floating gate 32, insulator film 32, and control gate 34 are formed on the step and so as to extend along both sides of the step.

With the illustrated arrangement, an n-type subdrain region 23 of low impurity concentration is formed so as to surround the n-type drain region 22. n-type subdrain region 23 reaches the shoulder part of the step. By this arrangement, the p-type channel region is defined in the region between the n-type source region 21 and n-type subdrain region 23.

A depletion layer extends along both sides of the pn junction formed by p-type channel region 20 and n-type subdrain region 23 and enables efficient acceleration of electrons. The accelerated electrons proceed rectilinearly as they are, pass through the gate insulator film 31, and become injected into floating gate 32.

The write memory element is preferably formed to have a cell structure, which enables charges to be injected at high speed and high injection efficiency, such as the cell structures of high CHE injection efficiency shown in FIG. 2(B) and FIG. 2(C), etc. On the other hand, the read memory element is preferably formed as the stack type memory cell of FIG. 2(A), which is suited for making the cell size small and for high speed reading.

The pixel structure of the present embodiment shall now be described in further detail.

Figure 3A:
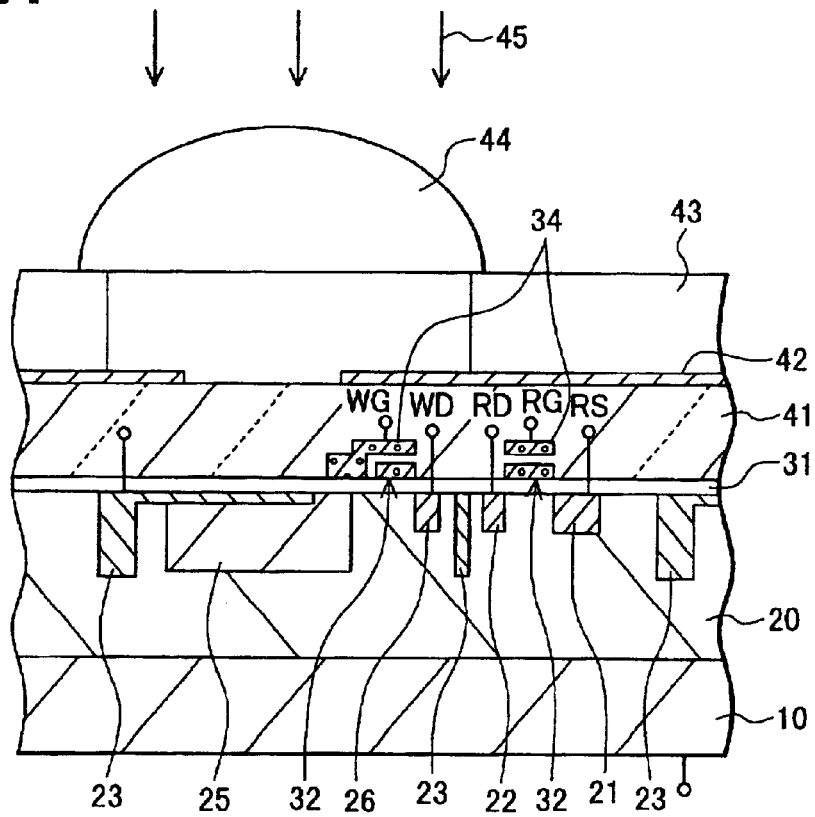
Figure 3A:
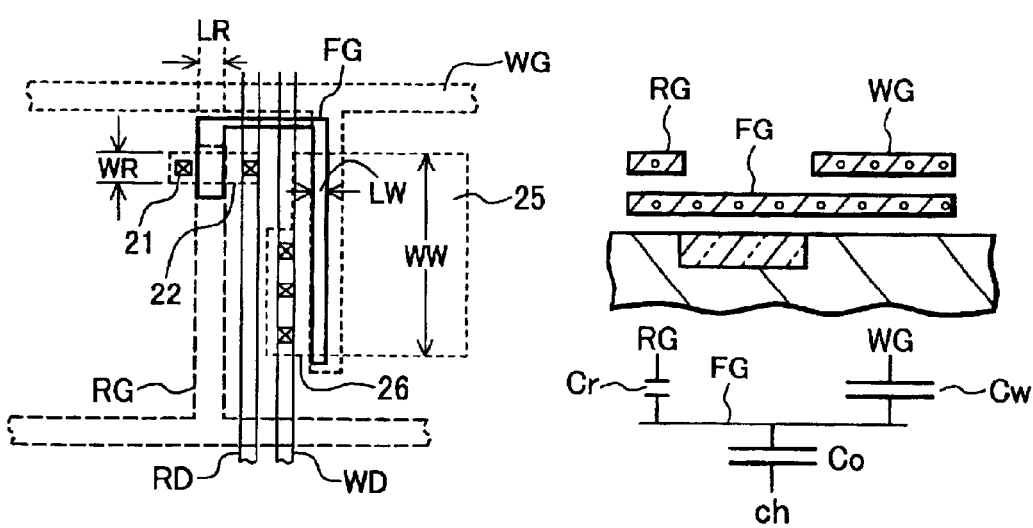

FIG. 3(A) shows a sectional view of a unit pixel. A p-type well 20 is formed on the surface region of an n-type silicon substrate 10. An n-type region 25 is formed on the surface region of p-type well 20, thereby forming a photodiode. A p+-type channel stopper region 23 is formed so as to surround the pixel region. A p+-type region is formed in continuation to channel stopper region 23 and so as to cover the surface of n-type region 25, thereby giving the photodiode an embedded photodiode structure. The isolation regions may be formed from an insulating substance, such as silicon oxide, etc.

An n+-type region 26 is formed in the vicinity of n-type region 25, which also serves as the source region of the write transistor, thereby forming the drain region of the write transistor. The region in between the n-type regions 25 and 26 becomes the channel region. An extended part 23 of the channel stopper region is formed at the right side of drain region 26, thereby electrically separating the left and right regions. At the right region, n+-type regions 21 and 22 are formed, thereby arranging the source region and drain region of the read transistor. The region in between the n+-type regions 21 and 22 becomes the channel region.

A split gate type gate electrode structure is formed above the channel region of the write transistor. A stack type gate electrode structure is formed above the channel region of the read transistor. Each control gate is formed separately. However, the floating gate of the read transistor and write transistor is formed as a single, continuous conductive film (for example, a polycrystalline silicon film).

FIG. 3(B) shows an example of the planer layout of the two transistors in a schematic manner. In this Figure, the left-right relationship is inverted with respect to that of FIG. 3(A). The n-type region 25 of the photodiode is positioned at the right side of the Figure and the write control gate WG is positioned above and capacitively coupled with a region to the left side of this n-type region 25. The floating gate FG is positioned below the drain side of write control gate WG.

Floating gate FG passes above the insulator region or the isolation region and extends to the left side of the Figure, thereby comprising the floating gate of the read transistor as well. The read control gate RG, which extends from below in the Figure, is positioned above and capacitively coupled with the floating gate of the read transistor.

If the length in the direction of current of the part below the floating gate FG is the channel length L, the channel length LR of the read transistor is selected to be longer than the channel length LW of the write transistor. Oppositely, the channel width WW of the write transistor is selected to be greater than the channel width WR of the read transistor.

Here, $LW*WW>LR*WR$. Preferably, $LW*WW>>LR*WR$. The ratio is, for example, is 2 times or more and more preferably, 4 times or more.

FIG. 3(C) shows, in a schematic manner, the relationship of the capacitive coupling of floating gate FG, write control gate WG and read control gate RG. The area across which write control gate WG opposes floating gate FG is greater and is preferably selected to be significantly greater than the area across which read control gate RG opposes floating gate FG. The ratio is, for example, is 2 times or more and more preferably, 4 times or more.

As shown in the lower part of FIG. 3(C), with such an electrode arrangement, the capacitance Cr, which floating gate FG forms with read control gate RG, will be less than the capacitance Cw, which write control gate WG forms with floating gate FG. Floating gate FG forms a capacitance Co with the substrate's channel region Ch.

The influence of the voltage of the control gate is applied to the channel region via floating gate FG. Due to the relationship of the magnitudes of capacitance, a larger voltage is required to control the potential of the channel region surface by the potential of read control gate RG than is required to perform the control by write control gate WG.

Thus in detecting the threshold value of the channel region, a larger voltage is applied by read control gate RG in comparison to the case where write control gate WG is used. The dynamic range for threshold reading is thus expanded.

Returning now to FIG. 3(A), an insulator layer 41 of resin, silicon oxide, etc., is formed above the gate electrodes of both transistors and the surface of this layer is flattened. A light shielding film 42, formed from metal, etc., is formed above insulator layer 41. Though light shielding film 42 has an opening, which allows the passage of light, formed above the n-type region 25 of the photodiode, it covers and shields incident light from the top parts of both transistor structures, the wiring regions, and other areas besides the photodiode. A color filter 43 is formed so as to cover insulator layer 41 and light shielding film 42 and a micro lens 44 is formed above color filter 43.

Incident light 45 is converged by micro lens 44, and after passing through color filter 43, is made incident on photodiode 25 via the opening of light shielding film 42. The shape and impurity concentration of n-type region 25 are set so that the entire region will be depleted. Electrons within n-type region 25 will therefore be dominated by those generated by the incidence of light.

n-type region 25 is the cathode region of the photodiode, and at the same time, functions as the source region of the write transistor. By applying a predetermined voltage to write control gate WG and write drain WD, the electrons generated at n-type region 25 are injected into the floating gate FG of the write transistor. Since the floating gate of the write transistor is also the floating gate of the read transistor, the injected electrons also become distributed to the floating gate of the read transistor. The threshold value of the read transistor is changed by these charges.

Since the source region of the write transistor does not have to be connected with an electrode, the impurity concentration can be set freely. Also, if an ohmic electrode is to be formed at the source region of the transistor, the concentration of the source region must be increased. In this case, it becomes difficult to deplete the cathode region of the photodiode completely.

By using a fully depleted photodiode, the fixed pattern noise can be reduced. Also, a p+-type region is formed at the surface side of the photodiode, thereby forming an embedded photodiode structure. The spectral sensitivity is thus improved and the dark current and pixel defects can be reduced.

When light is made incident on the photodetection part, an electron-hole pair is formed. The electrons are accumulated in the n-type source region. At the same time, a voltage is applied to write control gate WG and write drain WD. The electrons are drawn out to the channel of the MOS transistor structure, are accelerated, and thereby made into hot electrons. At least a part of these electrons generated by light are injected into the FG for a fixed amount of time (corresponding to the shutter speed). The threshold value Vth that has changed due to the charge injection is then read out by the other non-volatile memory element that has the read control gate RG.

That is, the non-volatile memory element that is controlled by the write control gate WG serves the role of injecting the charges, which have been generated by optical signals, into the floating gate FG. The non-volatile memory element that is controlled by the read control gate RG is used to read the change of threshold voltage that has occurred as a result of charge injection into the floating gate FG that is used in common.

In order to discharge the charges that have accumulated in photodiode PD, terminals for application of voltage to n-type substrate 10 are formed as shown in FIG. 3(A) and a vertical bipolar junction transistor type structure is arranged from n-type region 25, p-type well 20, and n-type substrate 10. By grounding the base (p well) and applying a positive potential to the collector (n-type substrate), the potential barrier of the base can be extinguished. That is, the transistor is turned ON and the emitter charges flow to the collector. Also, all write transistors WM can be turned ON and the charges can be discharged via the write transistors.

After exposure, the signal charge amount is read out as a change of the threshold value Vth. A voltage for reading is applied to control gate RG and drain RD of signal read memory element RM. The read control gate voltage at the point at which the drain current begins to flow is the threshold value of the cell. This threshold value Vth is read out as the output signal.

In the condition where the voltage necessary for optical writing is not applied to write control gate WG, the "optical writing," in other words, charge injection into floating gate FG will be prevented even if light is illuminated. Also, since the information (signal charges) that are "optically written" will remain in floating gate FG, the charge accumulated condition will be held even if the voltages at write control gate WG, read control gate RG, write drain WD, and read drain RD are eliminated (non-volatile condition). Thus when it is not required that all pixel signals be read out at high speed, the signals can be read arbitrarily or at low speed. As a result, the influence of switching noise will not be received readily as in the high-speed operation of the prior art, and low consumption power drive by low speed reading is enabled.

Prior to the subsequent image capturing process (optical writing), the residual signal charges, which correspond to the previous image in the floating gates FG, are removed. In general, with a non-volatile cell, data erasure is performed by drawing out the charges to the source S, drain D, substrate (well), or a separately provided gate dedicated to erasure by means of an F-N tunnel current.

Various data erasure methods can be considered for the present embodiment as well. Here, the method of applying a voltage to the control gates WG and RG and the substrate (or p well) to draw out the charges to the substrate shall be described as an example.

Unlike a normal non-volatile memory, there is no need to hold the data over a long period. With a solid state image pickup device, it is more convenient for high-speed drive to empty (erase) the charges in the floating gate FG after readout of the signal (change of Vth value) and thereby prepare for the next optical signal detection (image capture). Continuous or high-speed image capture is thus enabled.

For reading, a read voltage is applied to the control gate RG and drain RD of the non-volatile memory element for reading and the voltage at control gate RG, through which the channel current begins to flow, is detected as has been described above. During image capture, the write voltage can be applied simultaneously to an arbitrary number or all of the write control gates WG and write drains WD to perform simultaneous charge injection into the floating gates FG. A completely electronic shutter function that does not require a mechanical shutter is thus realized.

The threshold voltage Vth that is read is a voltage that corresponds to the signal quantity and is an analog value. A reading circuit that reads this Vth value is provided at the end part of each column of pixels that are aligned in a two-dimensional plane and the Vth value is compared to a reference voltage (Vref) that varies. The output of the comparator is converted into data that is quantized according to the required precision of detection (N bits (where N is an integer greater than or equal to 2)) and output to the horizontal read circuit. Digital signals are thus directly obtained from the solid state image pickup device.

The charge recording operation, reading operation, and erasure operation shall now be described. The control voltages for the respective operations are shown in the Table below.

TABLE

| | WD | RD | WG | RG | RS | p well |
|---|---|---|---|---|---|---|
| Write | Vcc | 0 | Vpp | 0 | 0 | 0 |
| Erasure | Open | Open | −Vpp | −Vpp | Open | Vcc |
| Read | 0 | Vr | 0 | Vd | 0 | 0 |

Here, Vpp > Vcc > Vr > 0 volt, Vd (variable).

After charge generation, Vpp and Vcc are applied to control gate WG and drain WD, respectively, in order to inject the charges into the floating gate FG of the write memory element. For reading, a variable voltage is applied to read control gate RG while applying Vr to read drain RD and the applied voltage at the point at which the channel of the read memory turns ON is detected. Though as has been mentioned above there are several methods of erasing the charges in floating gate FG, for the present embodiment, the method of drawing out the charges to the substrate (p well) shall be described. A negative voltage (−Vpp) is applied to write control gate WG and read control gate RG and a positive voltage (Vcc) is applied to the substrate (p well). The charges in the floating gate FG are thus drawn out into the substrate (p well).

Figure 4:
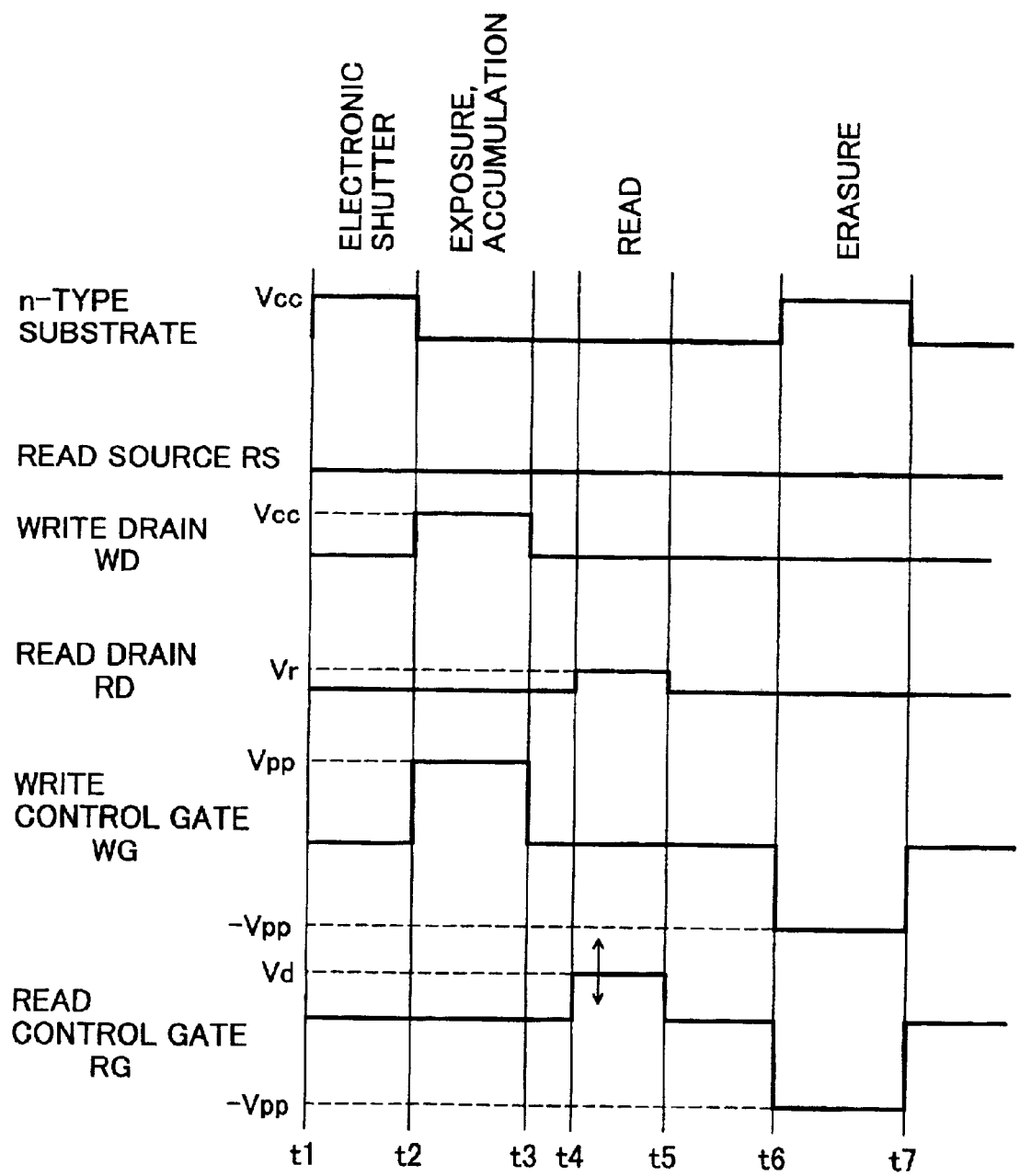
FIG. 4 is a timing chart of signals that control the operation of the solid state image pickup device.
Figure 5:
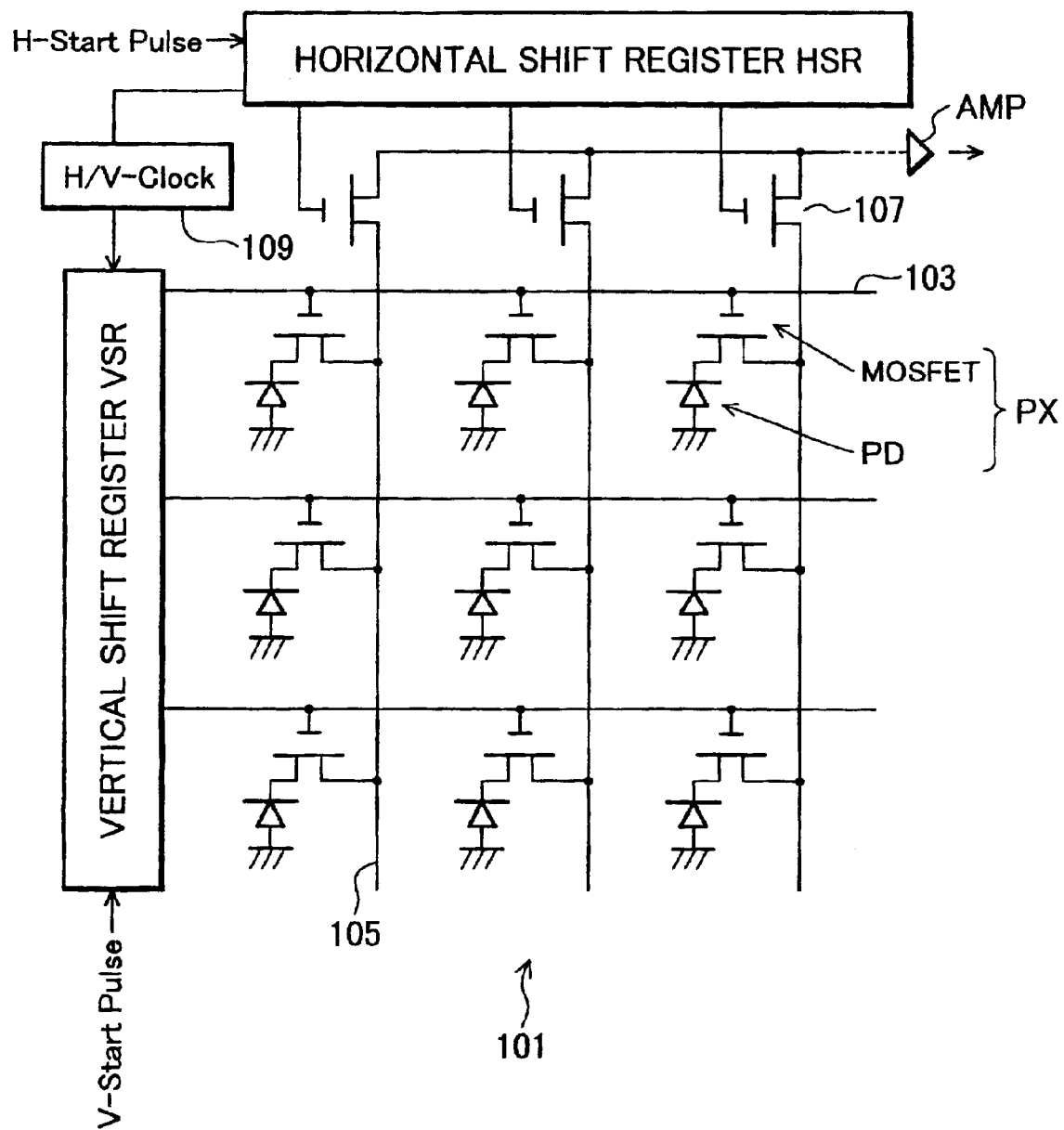
FIG. 5 is an equivalent circuit diagram of a prior-art MOS type solid state imaging device.
Figure 6:
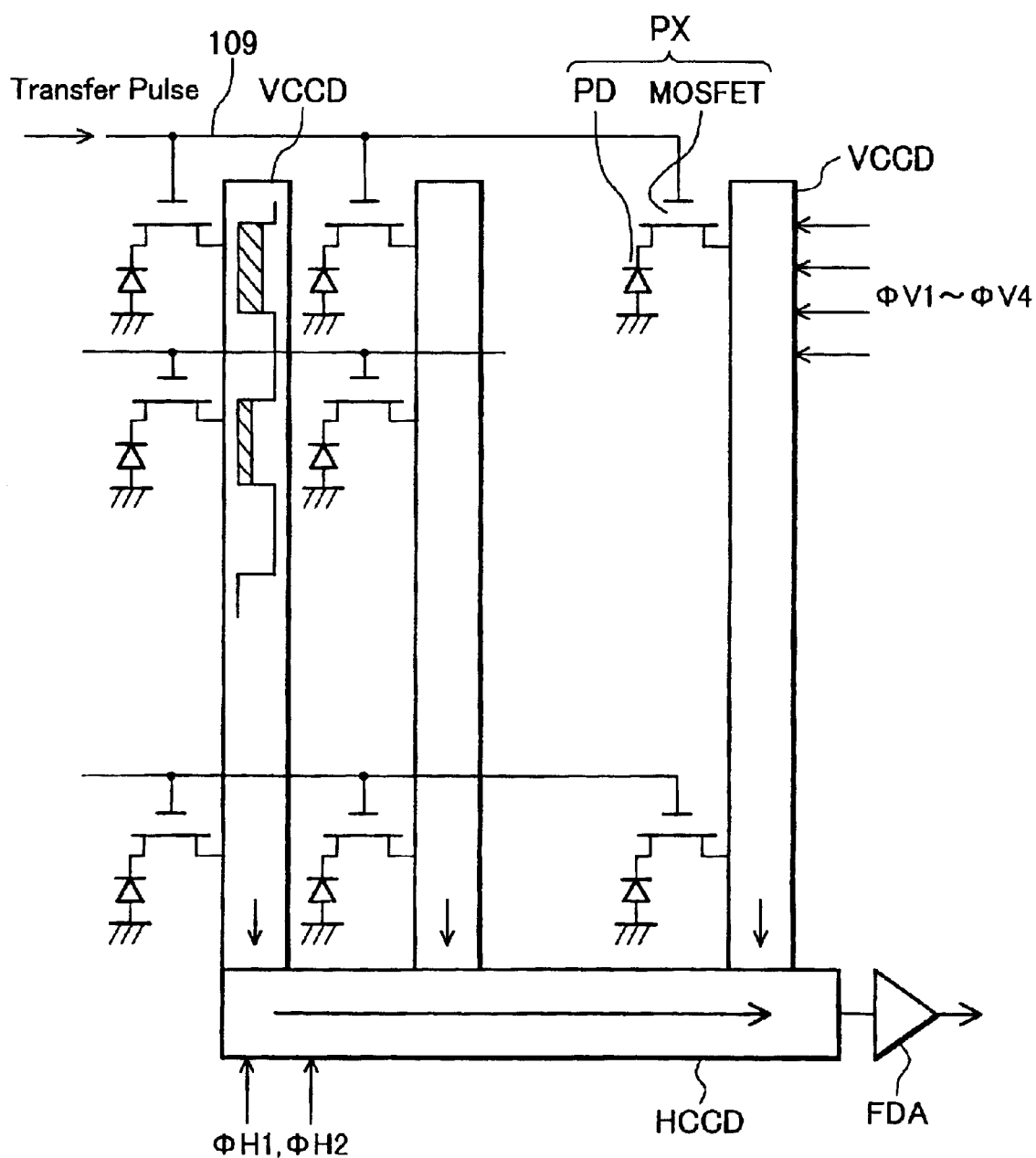
FIG. 6 is an equivalent circuit diagram of a prior-art IT-CCD type solid state imaging device.
Figure 7:
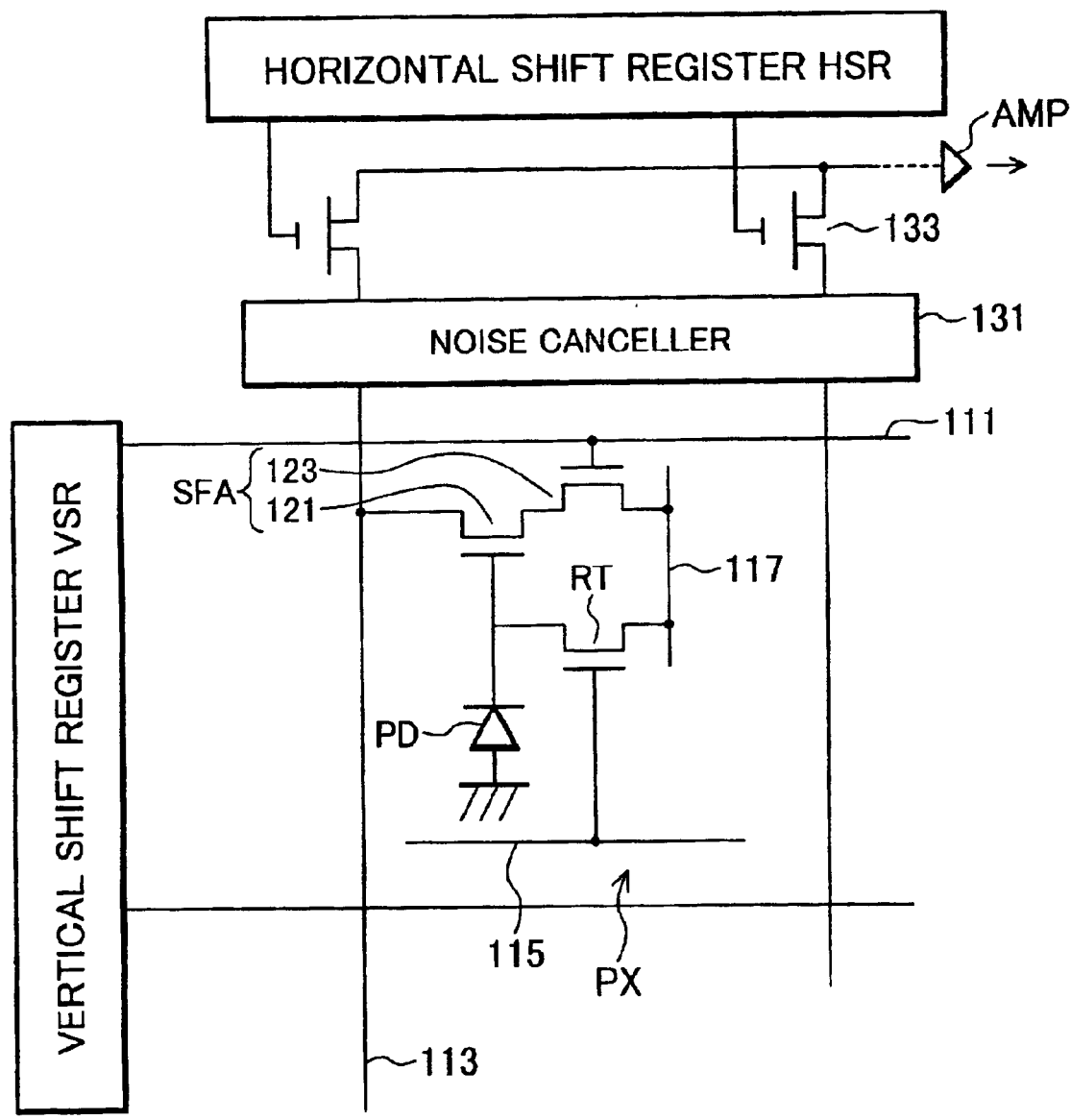
FIG. 7 is an equivalent circuit diagram of a prior-art CMOS type solid state imaging device.

The operation sequence of the present solid state image pickup device shall now be described with reference to FIG. 4. Even in the standby condition, external light is made incident on the photodetection part. The unnecessary charges must thus be drawn to the substrate side immediately prior to detection of light signals.

At a time t1, a positive potential (Vcc) is applied to the substrate and the charges in the vicinity of the photodetection part are swept out into the substrate, thereby resetting the photodetection part. After completion of sweeping, the voltage of the write drain WD is set to Vcc and a high write voltage (Vpp) is applied to control gate WG at time t2.

The charges that have been generated by light in the interval between time t2 and t3 are injected into floating gate FG. The time (t3−t2) thus corresponds to the exposure time, in other words, the shutter speed. Instead of performing writing during the exposure time, just the accumulation of charges may be performed in the initial stage of the exposure time and the voltage may be applied from the middle of the exposure time.

After accumulation (recording) of the optical signals in the FG, the reading of the recorded signals is performed from time t4. At time t4, the read drain RD voltage is set to Vr, a monotonously increasing voltage Vd is applied to read control gate RG, and the drain current corresponding to the voltage variation at control gate RG is detected. After reading has been completed at time t5, the charges in the FG's are erased in preparation for subsequent image capture.

In the interval between time t6 and t7, the voltage Vcc is applied to the substrate and the erasure voltage −Vpp is applied to write control gate WG and read control gate RG to draw the charges in floating gates FG to the substrate and p well side.

In order to make the potentials at the FG's of the respective unit pixels fall within a certain range of scattering, the potentials at the floating gate FG's of the respective pixels may be made to approach a fixed value. The non-uniformity of the detected optical signal intensity due to scattering of the floating gate FG values of the respective pixels can thus be reduced.

When the potentials of the floating gates FG after erasure of the respective memory cells are scattered, this scattering may affect the process in which the optical signal quantity is replaced by a threshold value and read, thus degrading the image quality. In this case, the threshold values of the respective cells may be reset to a fixed level (by charge injection or draw-out) to obtain accurate threshold value variation quantities based on optical signals.

Since the charges in floating gate FG are reset immediately after signal reading, so-called data retention (charge retention time) characteristics are not required. Charge injection is thus facilitated and high-speed, high-efficiency charge injection is enabled. With a prior-art non-volatile memory with which such high injection efficiency or high-speed recording was enabled, charge injection occurred at the same time as reading, causing the so-called disturbance phenomenon in which the Vt value fluctuates become significant. This disturbance phenomenon problem can be solved by providing a dedicated read memory element for solving the disturbance phenomenon and setting the write memory element to the OFF condition by not applying a voltage to (by grounding) the write drain during the read process.

Though this invention has been described by way of an embodiment above, this invention is not limited to this embodiment. For example, that various modifications, improvements, and combinations are possible should be clear to one skilled in the art.

What I claim are:

1. A solid state image pickup device comprising:
   a semiconductor substrate; and
   a plurality of pixels that are formed on said semiconductor substrate, with each pixel having a photodetection element, which generates signal charges upon receiving incident light, and a non-volatile memory structure, which is connected to said photodetection element, takes in at least part of said signal charges, and can generate a signal voltage corresponding to the signal charges.

2. The solid state image pickup device as set forth in claim 1, wherein said non-volatile memory structure has:
   a first MOS transistor structure equipped with a first floating gate, which is disposed above said semiconductor substrate; and
   a first control gate, which is capacitively coupled to said first floating gate.

3. The solid state image pickup device as set forth in claim 2, wherein said non-volatile memory structure further has a second MOS transistor structure equipped with a second floating gate, which is disposed above said semiconductor substrate and is electrically connected to said first floating gate, and a second control gate, which is capacitively coupled to said second floating gate.

4. The solid state image pickup device as set forth in claim 3, further comprising:
   a write control circuit, which is connected to said first MOS transistor structure and performs the control of injecting at least a part of said signal charges into said first floating gate; and
   a read control circuit, which is connected to said second MOS transistor structure and performs the control of reading a threshold value.

5. The solid state image pickup device as set forth in claim 4, wherein said read control circuit contains a threshold value reading circuit, analog/digital conversion circuit, buffer memory, and shift register.

6. The solid state image pickup device as set forth in claim 5, wherein said threshold value read circuit applies a monotonically varying voltage to said second control gate.

7. The solid state image pickup device as set forth in claim 4, wherein said write control circuit performs charge injection into said first floating gate by channel hot electron injection or tunnel electron injection in said first MOS transistor structure.

8. The solid state image pickup device as set forth in claim 3, wherein the area across which said second control gate opposes said second floating gate is smaller than the area across which said first control gate opposes said first floating gate.

9. The solid state image pickup device as set forth in claim 3, wherein said first MOS transistor structure is either a stack type cell, split type cell, or ballistic injection type cell, and said second MOS transistor structure is a stack type cell.

10. The solid state image pickup device as set forth in claim 7, wherein said first MOS transistor structure is either a stack type cell, split type cell, or ballistic injection type cell, and said second MOS transistor structure is a stack type cell.

11. The solid state image pickup device as set forth in claim 1, wherein said photodetection element is a fully depleted type pn junction diode with an embedded charge accumulating part.

12. A solid state image pickup device, comprising:
   a semiconductor substrate of a first conductivity type;
   a well region formed in said semiconductor substrate and having a second conductivity type that is opposite to the first conductivity type;
   a plurality of pn junction diodes, each of which has an embedded charge accumulation region of the first conductivity type formed within said well region;
   a plurality of first MOS transistor structures, each of which is associated with one of said embedded charge accumulation regions as a first source region, and has a first floating gate that is formed above said semiconductor substrate, a first control gate that is capacitively coupled to said first floating gate, and a first drain region that is formed within said well region; and
   second MOS transistor structures, each having a second source region and a second drain region, which are positioned in the vicinity of an associated one of said first MOS transistor structures and are formed within said well region, a second floating gate, which is formed above said semiconductor substrate and is electrically connected with said first floating gate, and a second control gate, which is capacitively coupled to said second floating gate.

13. A method of driving a solid state image pickup device comprising a semiconductor substrate of a first conductivity type, a well region formed in said semiconductor substrate and having a second conductivity type that is opposite to the first conductivity type, a plurality of pn junction diodes, each of which has an embedded charge accumulation region of the first conductivity type formed within said well region, a plurality of first MOS transistor structures, each of which is associated with one of said embedded charge accumulation regions as a first source region, and has a first floating gate that is formed above said semiconductor substrate, a first control gate that is capacitively coupled to said first floating gate, and a first drain region that is formed within said well region, and second MOS transistor structures, each having a second source region and a second drain region, which are positioned in the vicinity of an associate one of said first MOS transistor structures and are formed within said well region, a second floating gate, which is formed above said semiconductor substrate and is electrically connected with said first floating gate, and a second control gate, which is capacitively coupled to said second floating gate, said solid state image pickup device driving method comprising the steps of:
   (a) letting light incident on said plurality of pn junction diodes and accumulating charges that express image information in said embedded charge accumulation regions,
   (b) applying a write control voltage to said well regions and said first MOS transistor structures and injecting at least a part of said charges that express image information as signal charges into said first floating gate, and
   (c) applying a control voltage to said second MOS transistor structures and detecting a threshold voltage.

14. The solid state image pickup device driving method as set forth in claim 13, furthermore comprising the step of:
   (d) applying a control voltage to said well region and said first and second control gates and discharging the signal charges in said first and second floating gates into said well region.

15. The solid state image pickup device driving method as set forth in claim 14, furthermore comprising the step of:
   (e) applying an inverse bias voltage and a forward bias voltage to said semiconductor substrate and said well region, respectively, to discharge the charges in said embedded charge accumulation region to said semiconductor substrate.

* * * * *

UNITED STATES PATENT AND TRADEMARK OFFICE
CERTIFICATE OF CORRECTION

| | | |
|---|---|---|
| PATENT NO. | : 6,781,178 B2 | |
| APPLICATION NO. | : 10/100069 | |
| DATED | : August 24, 2004 | |
| INVENTOR(S) | : Makoto Shizukuishi | |

It is certified that error appears in the above-identified patent and that said Letters Patent is hereby corrected as shown below:

IN THE CLAIMS:
Claim 1, line 6, after "incident light,", insert -- an optical window formed above the photodetection element for allowing passage of incident light --.

Please add the following new claims:
-- 16. A solid state image pickup device as set forth in claim 1, wherein said non-volatile memory structure generates an analog signal voltage. --

-- 17. A solid state image pickup device comprising:
a semiconductor substrate having a well region of a first conductivity type;
a plurality of pixels that are formed on said semiconductor substrate, with each pixel having a photodiode including a charge storage region having a second conductivity type opposite to said first conductivity type and formed in said well region, which generates signal charges upon receiving incident light, an embedding semiconductor region of said first conductivity type formed above and embed said charge storage region, and a non-volatile memory structure, which is formed adjacent to said charge storage region, takes in at least part of said signal charges, and can provide a signal voltage corresponding to the signal charges. --

-- 18. The solid state image pickup device as set forth in claim 17, further comprising a light shielding film having an optical window disposed above said embedding semiconductor region in each of said pixels. --

-- 19. The solid state image pickup device as set forth in claim 18, further comprising a micro lens formed above each of said optical windows capable of converging incident light into said optical window. --

UNITED STATES PATENT AND TRADEMARK OFFICE
CERTIFICATE OF CORRECTION

PATENT NO. : 6,781,178 B2
APPLICATION NO. : 10/100069
DATED : August 24, 2004
INVENTOR(S) : Makoto Shizukuishi It is certified that error appears in the above-identified patent and that said Letters Patent is hereby corrected as shown below:

-- 20. The solid state image pickup device as set forth in claim 19, wherein said non-volatile memory structure has a common floating gate formed above said semiconductor substrate adjacent to said storage region, and being capable of taking in said at least part of said signal charges, and separate control gates formed above said floating gate at separate locations. --

Signed and Sealed this

Twenty-ninth Day of April, 2008

JON W. DUDAS
*Director of the United States Patent and Trademark Office*

UNITED STATES PATENT AND TRADEMARK OFFICE
CERTIFICATE OF CORRECTION

| | |
|---|---|
| PATENT NO. | : 6,781,178 B2 |
| APPLICATION NO. | : 10/100069 |
| DATED | : August 24, 2004 |
| INVENTOR(S) | : Makoto Shizukuishi |

It is certified that error appears in the above-identified patent and that said Letters Patent is hereby corrected as shown below:

IN THE CLAIMS:
Column 12, (Claim 1), line 33, after "incident light,", insert -- an optical window formed above the photodetection element for allowing passage of incident light --.

Column 14, line 47

Please add the following new claims:
-- 16. A solid state image pickup device as set forth in claim 1, wherein said non-volatile memory structure generates an analog signal voltage. --

-- 17. A solid state image pickup device comprising:
a semiconductor substrate having a well region of a first conductivity type;
a plurality of pixels that are formed on said semiconductor substrate, with each pixel having a photodiode including a charge storage region having a second conductivity type opposite to said first conductivity type and formed in said well region, which generates signal charges upon receiving incident light, an embedding semiconductor region of said first conductivity type formed above and embed said charge storage region, and a non-volatile memory structure, which is formed adjacent to said charge storage region, takes in at least part of said signal charges, and can provide a signal voltage corresponding to the signal charges. --

-- 18. The solid state image pickup device as set forth in claim 17, further comprising a light shielding film having an optical window disposed above said embedding semiconductor region in each of said pixels. --

-- 19. The solid state image pickup device as set forth in claim 18, further comprising a micro lens formed above each of said optical windows capable of converging incident light into said optical window. --

UNITED STATES PATENT AND TRADEMARK OFFICE
CERTIFICATE OF CORRECTION

PATENT NO. : 6,781,178 B2
APPLICATION NO. : 10/100069
DATED : August 24, 2004
INVENTOR(S) : Makoto Shizukuishi It is certified that error appears in the above-identified patent and that said Letters Patent is hereby corrected as shown below:

-- 20. The solid state image pickup device as set forth in claim 19, wherein said non-volatile memory structure has a common floating gate formed above said semiconductor substrate adjacent to said storage region, and being capable of taking in said at least part of said signal charges, and separate control gates formed above said floating gate at separate locations. --

This certificate supersedes the Certificate of Correction issued April 29, 2008.

Signed and Sealed this

Twentieth Day of May, 2008

JON W. DUDAS
*Director of the United States Patent and Trademark Office*